(12) United States Patent
Fujita et al.

(10) Patent No.: US 7,094,681 B2
(45) Date of Patent: Aug. 22, 2006

(54) SEMICONDUCTOR DEVICE FABRICATION METHOD

(75) Inventors: Keiji Fujita, Yokohama (JP); Rempei Nakata, Kamakura (JP); Hideshi Miyajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/701,476

(22) Filed: Nov. 6, 2003

(65) Prior Publication Data

US 2004/0135254 A1    Jul. 15, 2004

(30) Foreign Application Priority Data

Nov. 7, 2002    (JP)    ............... 2002-324104

(51) Int. Cl.
*H01L 21/4763*    (2006.01)
*H01L 21/44*    (2006.01)

(52) U.S. Cl. ............ 438/619; 438/623; 438/625; 438/637; 438/687

(58) Field of Classification Search ........... 438/622, 438/619, 623–640, 672, 675, 687–688, 778, 438/780–782
See application file for complete search history.

(56) References Cited

U.S. PATENT DOCUMENTS

| | | | |
|---|---|---|---|
| 6,420,441 B1 * | 7/2002 | Allen et al. | ............ 521/77 |
| 6,558,747 B1 | 5/2003 | Nakata et al. | |
| 6,737,365 B1 * | 5/2004 | Kloster et al. | ............ 438/778 |
| 2003/0232495 A1 * | 12/2003 | Moghadam et al. | ........ 438/623 |
| 2004/0175957 A1 * | 9/2004 | Lukas et al. | ............ 438/778 |
| 2004/0175958 A1 * | 9/2004 | Lin et al. | ............ 438/778 |

FOREIGN PATENT DOCUMENTS

| | | |
|---|---|---|
| JP | 2001-351916 | 12/2001 |
| JP | 2002-9078 | 1/2002 |

OTHER PUBLICATIONS

Japanese Patent Office Notification for Reasons of Rejection and English translation thereof.

* cited by examiner

*Primary Examiner*—Thanhha Pham
(74) *Attorney, Agent, or Firm*—Finnegan, Henderson, Farabow, Garrett & Dunner, L.L.P.

(57) ABSTRACT

Disclosed is a semiconductor device comprising a semiconductor substrate, a porous insulating film formed above the semiconductor substrate, the porous insulating film having a relative dielectric constant of 2.5 or less and including a first insulating material, at least a portion of pores in the porous insulating film having on the inner wall thereof a layer of a second insulating material which differs in nature from the first insulating material, and a plug and/or a wiring layer buried in the porous insulating film.

16 Claims, 2 Drawing Sheets

SEMICONDUCTOR DEVICE FABRICATION METHOD

CROSS-REFERENCE TO RELATED APPLICATIONS

This application is based upon and claims the benefit of priority from the prior Japanese Patent Application No. 2002-324104, filed Nov. 7, 2002, the entire contents of which are incorporated herein by reference.

BACKGROUND OF THE INVENTION

1. Field of the Invention

This invention relates to a semiconductor device and to the manufacturing method thereof, and in particular, to a semiconductor device having a low dielectric constant film as an interlayer insulating film and to the manufacturing method thereof.

2. Description of the Related Art

In order to minimize any delay of wiring portions in a semiconductor device, it is highly desirable to minimize the relative dielectric constant of an interlayer insulating film. In order to secure a sufficiently low relative dielectric constant, it is possible to employ a method wherein the interlayer insulating film is made into a porous insulating film by incorporating voids or pores into the interlayer insulating film. In this regard, it is possible, in the case of an organic silicone film to reduce the relative dielectric constant of the film to 2.5 or less if the average diameter of the pores is within the range of about 2 to 3 nm.

The larger the diameter of pores is, the lower the relative dielectric constant of the insulating film would become. However, even if it is possible to lower the relative dielectric constant of insulating film in this manner, the reliability of wirings may be badly affected by this. For example, in the case of a porous insulating film whose maximum pore diameter is 4 nm or more, the following inconveniences would be brought about on the occasion of forming a metal wiring by a damascene method. Namely, if such an insulating film is worked to form a trench therein, pores of relatively large size are exposed from the sidewall of the trench, thus producing hollows thereon. As a result, it becomes difficult to form a continuous barrier metal film thereon. As a result, the reliability of wirings may be badly deteriorated.

On the other hand, if the average diameter of pores in the porous insulating film is to 1 nm or less, it may become difficult to sufficiently minimize the relative dielectric constant of interlayer insulating film.

BRIEF SUMMARY OF THE INVENTION

A semiconductor device according to one embodiment of the present invention comprising:
a semiconductor substrate;
a porous insulating film formed above the semiconductor substrate, the porous insulating film having a relative dielectric constant of 2.5 or less and including a first insulating material, at least a portion of pores in the porous insulating film having on the inner wall thereof a layer of a second insulating material which differs in nature from the first insulating material; and
a plug and/or a wiring layer buried in the porous insulating film.

A semiconductor device according to another embodiment of the present invention comprising:
a semiconductor substrate;
a porous insulating film formed above the semiconductor substrate and having a relative dielectric constant of 2.5 or less, an average diameter of pores in the porous insulating film being smaller in a surface region of the porous insulating film than in an inner region of the porous insulating film; and
a plug and/or a wiring layer buried in the porous insulating film.

A method for manufacturing a semiconductor device according to one embodiment of the present invention comprises:
forming a porous insulating film above a semiconductor substrate, the porous insulating film having a relative dielectric constant of 2.5 or less;
forming a recessed portion on a surface of the porous insulating film; and
filling the recessed portion with a conductive material to form a plug and/or a wiring layer;
wherein prior to filling the recessed portion with the conductive material, the porous insulating film is placed inside a chamber to expose the porous insulating film to an oxidizing gas flow and a reducing gas flow which have been alternately introduced into the chamber, to take place an oxidation-reduction reaction in the porous insulating film, thereby forming a layer of a reaction product on inner walls of pores of the porous insulating film.

A method for manufacturing a semiconductor device according to another embodiment of the present invention comprises:
forming a porous insulating film above a semiconductor substrate;
forming a recessed portion on a surface of the porous insulating film; and
filling the recessed portion with a conductive material to form a plug and/or a wiring layer;
wherein the porous insulating film is irradiated with electron beam to enlarge the size of pores of the porous insulating film.

DETAILED DESCRIPTION OF THE INVENTION

Next, specific embodiments of the present invention will be explained with reference to drawings.

EMBODIMENT 1

Figure 1A:
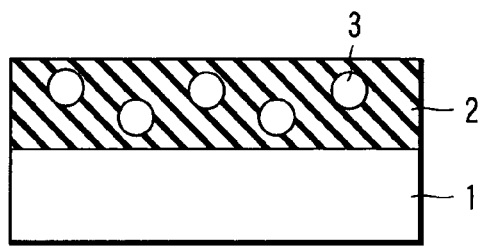
FIGS. 1A to 1C respectively shows a cross-sectional view for illustrating the manufacturing method of a semiconductor device according to Embodiment 1 of the present invention.
Figure 1C:
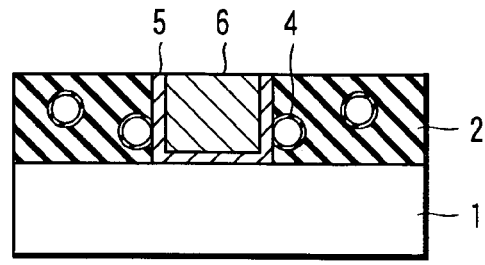
Figure 1B:
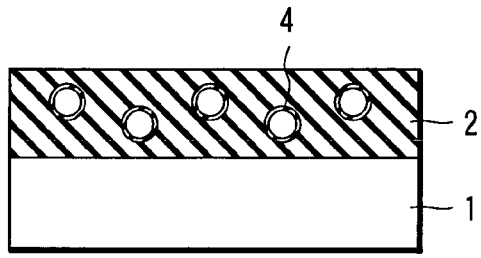

FIGS. 1A to 1C respectively shows a cross-sectional view for illustrating the manufacturing method of a semiconductor device according to one embodiment of the present invention.

First of all, as shown in FIG. 1A, a porous insulating film 2 is formed on a semiconductor substrate 1 having semiconductor elements (not shown) formed thereon. The porous insulating film 2 may be constituted by either an organic insulating film or an organic silicone film, which may be deposited by a coating method or a CVD method. More specifically, examples of the organic insulating film include polyarylene and polyarylene polyether. Examples of the organic silicone film include methylsilsesquioxane (MSQ), polymethyl siloxane (MSX), etc. It is also possible to employ any other insulating films as long as they are porous.

If a porous insulating film 2 formed of an MSQ film is deposited on a substrate by a coating method, one having a weight average molecular weight ranging from 100,000 to 10,000,000 or so is dissolved in an organic solvent such as an alcoholic solvent to prepare a varnish, which is then coated on a semiconductor substrate 1 and heated for 10 to 120 minutes at a temperature ranging from 200 to 500° C. to vaporize the solvent. Thereafter, the coated layer is further heated to take place a chemical bonding reaction to obtain a porous insulating film 2 having a relative dielectric constant of 2.5 or less.

The pores in the porous insulating film 2 thus obtained are not in a completely independent state but are partially communicated with each other through a fine space formed between neighboring pores, thus to reach the surface of the film. The diameter of these pores can be observed by cross-sectional transmission electron microscopy (TEM). As shown in FIG. 1A, there will be sometimes recognized the existence of a large pore 3 having a maximum diameter of 4 nm or more.

If a trench is formed at a region where such a large pore 3 is formed in a subsequent step, a hollow having a size corresponding to the size of the pore 3 is formed on the sidewall of the trench, thereby making it difficult to form a continuous barrier metal film.

In the present embodiment however, an oxidation-reduction reaction is permitted to take place in the porous insulating film 2 by using an ALD (Atomic Layer Deposition)-CVD device prior to forming a trench in the porous insulating film 2, thereby making it possible to reduce the size of the large pore 3 to an optimum size.

To be more specific, first of all, the semiconductor substrate 1 having the porous insulating film 2 formed thereon is placed in a film-forming chamber and heated to a temperature ranging from 200 to 500° C., for example 400° C. and at the same time, an oxidizing gas and a reducing gas are alternately introduced into the chamber under a pressure ranging from 0.1 to 10 Torr, for example 5 Torr.

As for the oxidizing gas, it is possible to employ at least one selected from the group consisting of $O_2$, $N_2O$, $Cl_2$, $F_2$, $O_3$ and $WF_6$. As for the reducing gas, it is possible to employ at least one selected from the group consisting of $SiH_4$, $H_2$ and HF. These two kinds of gases can be employed in any optional combination with the flow rate thereof being controlled to range from 10 to 500 sccm, for example 100 sccm.

When $O_2$ gas is employed as an oxidizing gas and $SiH_4$ gas is employed as a reducing gas, the $SiH_4$ gas is introduced into the chamber for 30 seconds at a flow rate of 100 sccm, which is followed by a purging step of 30 seconds using Ar gas. Then, the $O_2$ gas is introduced into the chamber for 30 seconds at a flow rate of 100 sccm, which is followed by a purging step of 30 seconds using Ar gas. Namely, one cycle of treatment using gases is accomplished by the sequential introduction of $SiH_4$ gas-Ar gas-$O_2$ gas-Ar gas in this manner. The period of time for introducing each of these gases may be optionally selected from a period of 5 to 60 seconds.

Although it is possible, with the employment of Ar gas as a purging gas, to discharge the $SiH_4$ gas from the chamber, the $SiH_4$ gas that has been introduced into the pores of the porous insulating film 2 adsorbs onto the inner walls of the pores. When $O_2$ gas is subsequently introduced into the chamber, the residual $SiH_4$ gas left remained inside the pores reacts with this $O_2$ gas to deposit the reaction product, i.e. silicon oxide ($SiO_2$) 4 on the inner walls of pores, as shown in FIG. 1B.

This means that at least some of the pores 3 of the porous insulating film (a first insulating material) which is formed of an organic insulating film or an organic silicone film are enabled to have a layer of reaction product (a second insulating material) 4.

In this manner, it is possible to reduce the maximum diameter of the pores 3 to 3 nm or less through the deposition of the reaction product 4 on the inner walls of the pores. It has been confirmed that as long as the maximum diameter of the pores 3 is 3 nm or less, the formation of a barrier metal film would not be badly affected by the pores 3 even if the pores 3 are exposed from the sidewall of trench due to the trench-forming work. It has been also confirmed that when the aforementioned cycle of treatment using gases is repeated 50 times under the aforementioned conditions, the pores having a diameter of 5 nm can be reduced in size to 2 nm in diameter.

Figure 2A:
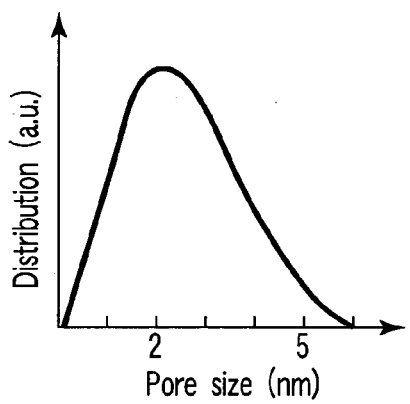
FIGS. 2A and 2B are graphs illustrating the distribution of pore size in a porous insulating film.
Figure 2B:
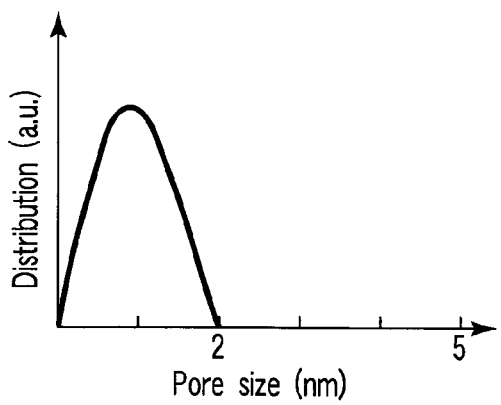

The distribution of pore size in the porous insulating film 2 before and after the aforementioned treatment is shown in the graphs of FIGS. 2A and 2B, respectively. Specifically, FIG. 2A shows the distribution before the treatment and FIG. 2B shows the distribution after the treatment. Since these gases can be easily introduced into the pores and the quantity of gases to be deposited thereon would be relatively large, the reaction product 4 would be deposit on the inner wall of larger pores 3 in preference to the inner wall of smaller pores 3. Therefore, as clearly shown in FIG. 2B, the pores 3 having a diameter of 4 nm or more do not exist after the treatment.

Figure 3A:
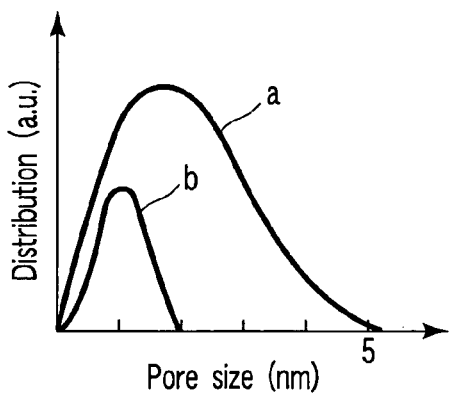
FIGS. 3A and 3B are graphs illustrating the distribution of pore size in a porous insulating film.
Figure 3B:
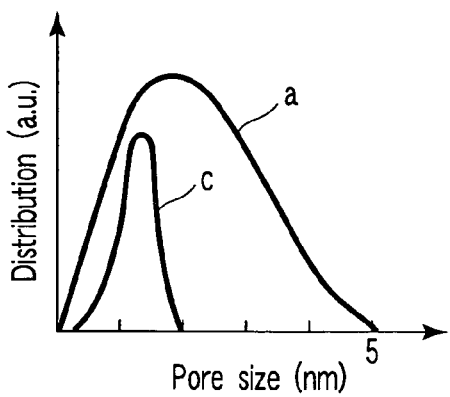

As far as the porous insulating film 2 is concerned, since the gases can be more easily penetrate into the surface region thereof as compared with the inner region thereof, the quantity of the reaction product 4 to be deposited on the surface region of porous insulating film 2 can be made larger than that to be deposited on the inner region of porous insulating film 2. FIGS. 3A and 3B illustrate the changes in pore size due to the aforementioned treatment in the surface region as well as in the inner region of the porous insulating film 2. More specifically, FIG. 3A represents the distribution of pore size in the surface region occupying about 20% of the entire thickness of the porous insulating film 2, and FIG. 3B represents the distribution of pore size in the middle region in thickness-wide of the porous insulating film 2. In any of these graphs, the distribution of pore size before the aforementioned treatment (FIG. 2A) is represented by the curve "a". The distribution of pore size in the surface region after the aforementioned treatment was such that the peak thereof was located around 1 nm as shown by the curve "b" and the mean diameter of the pore size was about 1.0 nm. On the other hand, the distribution of pore size in the middle region after the aforementioned treatment was such that the peak thereof was located around 1.5 nm as shown by the curve "c" and the mean diameter of the pore size was about 1.3 nm. It will be seen from these graphs that an average diameter of the pore size in the porous insulating film 2 was made smaller in the surface region as compared with that in the inner region of the porous insulating film 2.

As the average diameter of the pore size in the surface region of the pores 3 is made smaller than that of the inner region of the porous insulating film 2 in this manner, the hardness and the density of the porous insulating film 2 are enabled to increase, thereby making it possible to enhance the mechanical and chemical strength of the porous insulating film 2. As a result, it is now possible to enhance the resistance of the porous insulating film 2 on the occasion of ashing for removing a resist employed for forming the trench, on the occasion of treatments using a chemical liquid, or on the occasion of polishing treatment for burying a plug or a wiring layer in the trench.

Moreover, since the maximum diameter of the pores 3 is reduced in advance to 3 nm or less, the formation of a barrier metal film would not be badly affected by the pores 3 even if a hollow is formed on the sidewall of trench due to the trench-forming work for forming wirings or contacts on the porous insulating film 2 after the treatment of the pores 3. Therefore, it is now possible to form a continuous barrier metal film 5 of Ta or TaN inside the trench and to bury a Cu wiring 6 in the trench as shown in FIG. 1C.

EMBODIMENT 2

The pores of large diameter in the porous insulating film can be reduced in size by using an oxidation-reduction reaction after forming the trench.

Figure 4A:
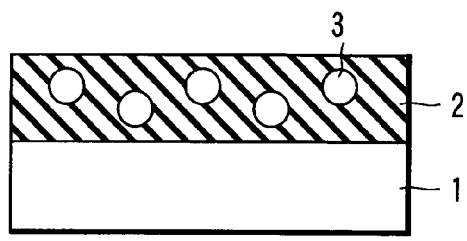
FIGS. 4A to 4C respectively shows a cross-sectional view for illustrating the manufacturing method of a semiconductor device according to Embodiment 2 of the present invention.
Figure 4C:
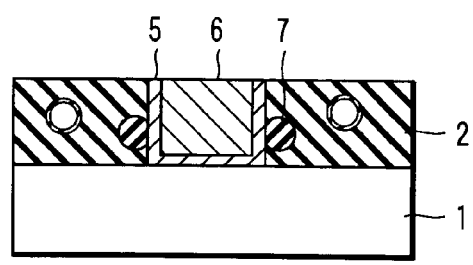
Figure 4B:
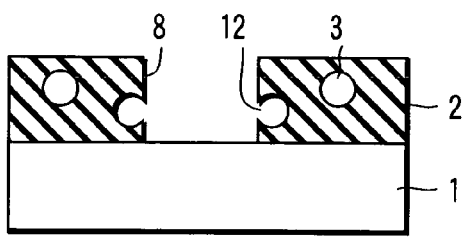

FIGS. 4A to 4C respectively shows a cross-sectional view for illustrating the manufacturing method of a semiconductor device according to Embodiment 2.

By following the same procedures as illustrated in the previous Embodiment 1, a porous insulating film 2 is formed on a semiconductor substrate 1 as shown in FIG. 4A. On this occasion, there will be sometimes recognized the existence of a large pore 3 having a maximum diameter of 4 nm or more in the porous insulating film 2.

In this embodiment, a trench 8 is formed in such a porous insulating film 2. As a result, as shown in FIG. 4B, a hollow 12 having a size corresponding to the size of the pore 3 is formed on the sidewall of the trench 8.

The semiconductor substrate 1 having thereon the porous insulating film 2 accompanying the hollow 12 is placed in the same film-forming chamber as employed the previous embodiment and heated in the same manner as illustrated in the previous embodiment and at the same time, an oxidizing gas and a reducing gas are alternately introduced into the chamber. In the case of the porous insulating film 2 to be treated in this embodiment, since the hollow 12 is formed on the sidewall of the trench 8, the conditions for introducing these gases into the chamber should be suitably altered to enable the hollow 12 to be selectively filled with the reaction product. Namely, the hollows, i.e. the pores that have been exposed from the sidewall of the trench can be selectively filled with a reaction product by raising the pressure in the chamber and by shortening the time for introducing each of the gases. Specifically, the aforementioned selective filling of the pores can be achieved by setting the pressure inside the chamber to the range of about 1 to 50 Torr, for example 10 Torr, and by setting the time for introducing each of the oxidizing gas, the reducing gas and the purging gas to the range of about 10 to 30 seconds, for example 10 seconds.

By performing the treatment of the porous insulating film 2 in this manner after forming the trench, the hollows formed on the sidewall of the trench can be selectively filled with a reaction product without unduly reducing the diameter of the pores located in the inner region of the porous insulating film 2. Therefore, it is now possible to form a continuous barrier metal film 5 of Ta or TaN inside the trench and to bury a Cu wiring 6 in the trench as shown in FIG. 4C. As already explained above, since the reaction product 7 deposits on the pores 3 existing in the surface region in preference to the pores 3 located in the inner region of the porous insulating film 2, the porous insulating film 2 thus treated would become such that in addition to the contraction in size of the pores located in the surface region as mentioned above, the pores 3 which are located near the wiring layer would also be contracted in size.

According to the method set forth by this embodiment, the hollows formed on the sidewall of the trench can be selectively filled with a deposited material, while permitting the pores located in the inner region of the porous insulating film 2 to keep their larger size. Therefore, this method is advantageous in that the relative dielectric constant of the porous insulating film can be maintained at a lower level.

EMBODIMENT 3

Figure 5A:
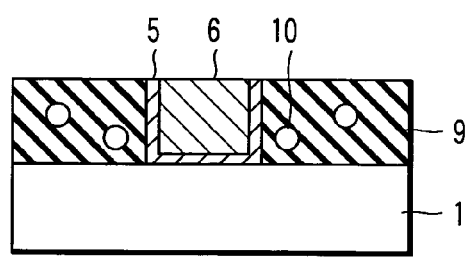
FIGS. 5A and 5B respectively shows a cross-sectional view for illustrating the manufacturing method of a semiconductor device according to Embodiment 3 of the present invention.
Figure 5B:
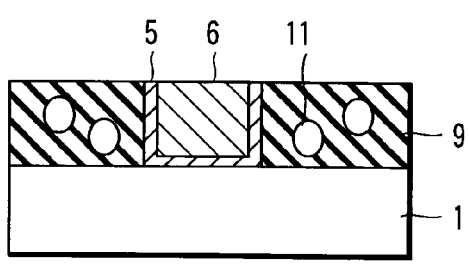

FIGS. 5A and 5B respectively shows a cross-sectional view for illustrating the manufacturing method of a semiconductor device according to Embodiment 3 of the present invention.

As shown in FIG. 5A, a porous insulating film 9 is formed on a semiconductor substrate 1 having semiconductor elements (not shown) formed thereon and a trench is formed in the porous insulating film 9, which is then filled with a Cu wiring 6 with a barrier metal film 5 being interposed therebetween. The porous insulating film 9 may be constituted by either an organic silicone film having $CH_3$ group (for example, MSQ film, MSX film, etc.) or an organic insulating film (for example, polyarylene, polyarylene polyether, etc.).

When a porous insulating film 9 consisting of an MSQ film is formed by coating method, very minute pores 10 having an average diameter of 1 nm or less may be formed in the porous insulating film 9, depending on the conditions to be employed. Namely, this phenomenon may be generated when an MSQ film is formed by the procedures wherein MSQ having a weight average molecular weight ranging from 100 to 10,000 or so is dissolved in an organic solvent such as an alcoholic solvent to prepare a varnish, which is then coated on a semiconductor substrate 1 and heated for 10 to 120 minutes at a temperature ranging from 200 to 500° C. to vaporize the solvent, and thereafter, the coated layer is further heated to take place a chemical bonding reaction to obtain the porous insulating film.

Further, even when the porous insulating film 9 is formed by CVD method, very minute pores 10 having an average diameter of 1 nm or less may be formed in the porous insulating film 9, depending on the conditions to be employed. Namely, the conditions which enable the formation of such an insulating film are: where a plane-parallel plate plasma CVD apparatus is employed, 350° C. in film-forming temperature; 600/100/200 sccm in the ratio of trimethyl silane $SiH(CH_3)_3/He/O_2$; 4 Torr; and 400 W in RF power.

In the case of this porous insulating film 9, since the average diameter of the pores 10 is very small, there would be little possibility of raising problems such as defective filling of a barrier metal even if the pores 10 exposes from the sidewall of the trench due to the aforementioned trench-forming work. Therefore, it is possible to form a wiring excellent in reliability. However, it would be impossible to sufficiently decrease the relative dielectric constant of the insulating film, thus the insulating film exhibits a dielectric constant of 2.5 or more.

Therefore, it is proposed in this embodiment to enlarge the diameter of the pores by etching the inner wall of the pores located in the inner region of the insulating film by irradiating an electron beam (EB). This can be accomplished, where an organic silicone film is employed, by introducing $N_2$ gas or $O_2$ gas at a flow rate ranging from 100 to 10000 sccm, for example 1000 sccm under the conditions of: 1–20 kV, for example 10 kV in accelerating voltage; 0.1–100 Torr, for example 10 Torr in pressure; and 10–20000 $\mu C/cm^2$, for example 600 $\mu C/cm^2$ in dosage of EB. In the case where an organic insulating film is employed, not only $N_2$ gas and $O_2$ gas but also $H_2$ gas can be used.

For example, when an organic silicone film is irradiated with EB in $N_2$ gas atmosphere, $N_2$ gas that has been introduced into the pores can be excited to generate radicals, thereby enabling the inner wall of the pores to be etched through the elimination of $CH_3$ group from the organic silicone film. As a result, the pores are enlarged, forming enlarged pores 11 as shown in FIG. 5B. In the case of the organic insulating film, carbon in the insulating film can be eliminated, thereby enlarging the pores 10 in size.

Figure 6A:
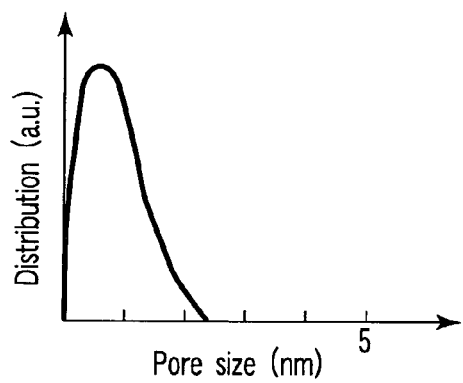
FIGS. 6A and 6B are graphs illustrating the distribution of pore size in a porous insulating film.
Figure 6B:
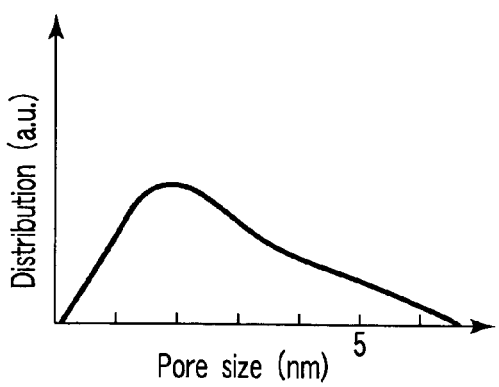

FIGS. 6A and 6B show the changes in distribution of pore size in a porous insulating film before and after the irradiation of EB. FIG. 6A shows a distribution of pore size prior to the irradiation of EB, wherein the average diameter thereof is as small as 1 nm or less. When the porous insulating film is irradiated with EB, the diameter of the pores is enlarged as a whole, thereby making it possible to obtain the pores having an average diameter ranging from about 2 to 3 nm as shown in FIG. 6B. As a result, the relative dielectric constant of the porous insulating film can be reduced to 2.5 or less.

In the embodiment described above in particular, since the irradiation of EB is performed after burying the wiring, the properties of the barrier metal film buried in this manner would not be badly affected even if pores of relatively large size are generated in the insulating film. Rather, it would become more advantageous by increasing the size of the pores to lower the relative dielectric constant of the insulating film. Therefore, the insulating film may include pores having a diameter of 5 nm or more, thereby making it possible, in this case, to lower the relative dielectric constant of the insulating film to not higher than 2.

Incidentally, the magnitude of etching of the inner wall of the pores can be controlled by adjusting the dosage of EB. Namely, the larger the dosage of EB is, the larger the magnitude of etching would become. Therefore, it is possible, through the adjustment of the dosage of EB, to increase the diameter of pores to a desired magnitude. For example, if it is desired to confine the maximum diameter of the pores after etching for enlarging the pore size to 3 nm or so, the dosage of EB may be more or less decreased, for example, to 300 $\mu C/cm^2$. In this case, the other conditions such as accelerating voltage and pressure may be the same as mentioned above.

This technique can be applied to the porous insulating film before burying wirings, more specifically, prior to or subsequent to forming the trench, thereby enabling the pores having an average diameter of not more than 1 nm to have an enlarged diameter of 3 nm or so at maximum. Since the maximum diameter of the pores can be controlled to not larger than 3 nm after enlarging the diameter of the pores, even if the pores are exposed from the sidewall of the trench to form hollows thereon, the properties of the barrier metal film buried as described above would not be badly affected. Moreover, it is possible, in this case, to lower the relative dielectric constant of the insulating film to not higher than 2.5.

As describe above in detail, according to these embodiments of the present invention, it is possible to provide a semiconductor device having an insulating film which is sufficiently low in relative dielectric constant. Further, according to the these embodiments of the present invention, it is possible to provide a method of manufacturing a semiconductor device, which is capable of forming an insulating film which is sufficiently low in relative dielectric constant without possibilities of inviting the deterioration of the properties of a barrier metal film.

The present invention would be highly useful in the manufacture of a semiconductor device having a multi-layer wiring structure, in particular, a damascene wiring structure, thus rendering the present invention very valuable in industrial viewpoints.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming a porous insulating film above a semiconductor substrate, said porous insulating film including pores therein;

forming a recessed portion on a surface of said porous insulating film;

filling said recessed portion with a conductive material to form at least one of a plug and a wiring layer; and subsequent to filling said recessed portion with said conductive material, enlarging sizes of said pores through radiation of an electron beam onto said porous insulating film.

2. The method according to claim 1, wherein before said enlarging said pores of said porous insulating film formed above said semiconductor substrate have an average diameter of 1 nm or less.

3. The method according to claim 1, wherein filling said recessed portion with said conductive material to form at least one of said plug and said wiring layer includes depositing a Cu layer through a barrier metal film.

4. The method according to claim 1, wherein, in forming said porous insulating film, said pores of said porous insulating film are formed by procedures including:

coating a varnish on said semiconductor substrate to form a coated layer;

heating said coated layer to vaporize a solvent in said varnish; and further heating said coated layer to take place a chemical bonding reaction.

5. The method according to claim 4, wherein said varnish is prepared by dissolving a porous insulating film material selected from the group consisting of methylsilsesquioxane, polymethyl siloxane, polyarylene, and polyarylene polyether.

6. The method according to claim 5, wherein said porous insulating film material is methylsilsesquioxane having a weight average molecular weight ranging from 100 to 10,000.

7. The method according to claim 1, wherein said porous insulating film is irradiated with said electron beam in the presence of at least one gas.

8. The method according to claim 7, wherein said electron beam is irradiated at 1–20 kV in accelerating voltage.

9. The method according to claim 7, wherein said electron beam is irradiated at 10–20000 $\mu C/cm^2$ in dosage of EB.

10. The method according to claim 7, wherein said gas is introduced under condition of 0.1–100 Torr in pressure.

11. The method according to claim 7, wherein said gas that has been introduced into said pores is excited to etch an inner wall of said pores.

12. The method according to claim 11, wherein said porous insulating film is an organic silicone film and said inner wall of said pores is etched through said elimination of $CH_3$ group from said organic silicone film.

13. The method according to claim 11, wherein said porous insulating film is an organic silicone film and said gas is selected from the group consisting of $N_2$ gas and $O_2$ gas.

14. The method according to claim 13, wherein said gas is introduced at a flow rate ranging from 100 to 10000 sccm.

15. The method according to claim 11, wherein said porous insulating film is an organic insulating film and said inner wall of said pores is etched through said elimination of carbon in said organic insulating film.

16. The method according to claim 11, wherein said porous insulating film is an organic insulating film and said gas is selected from the group consisting of $N_2$ gas, $O_2$ gas, and $H_2$ gas.

* * * * *

UNITED STATES PATENT AND TRADEMARK OFFICE
CERTIFICATE OF CORRECTION

PATENT NO. : 7,094,681 B2 Page 1 of 1
APPLICATION NO. : 10/701476
DATED : August 22, 2006
INVENTOR(S) : Fujita et al.

It is certified that error appears in the above-identified patent and that said Letters Patent is hereby corrected as shown below:

Claim 2, column 8, line 49, change "enlarging said" to --enlarging, said--.

Signed and Sealed this

Fifth Day of December, 2006

JON W. DUDAS
*Director of the United States Patent and Trademark Office*